US010838309B2

(12) United States Patent
Wittebrood

(10) Patent No.: US 10,838,309 B2
(45) Date of Patent: Nov. 17, 2020

(54) DEVICE MANUFACTURING METHOD AND PATTERNING DEVICES FOR USE IN DEVICE MANUFACTURING METHOD

(71) Applicant: ASML Netherlands B.V., Veldhoven (NL)

(72) Inventor: Friso Wittebrood, Cuijk (NL)

(73) Assignee: ASML Netherlands B.V., Veldhoven (NL)

( * ) Notice: Subject to any disclaimer, the term of this patent is extended or adjusted under 35 U.S.C. 154(b) by 155 days.

(21) Appl. No.: 15/548,407

(22) PCT Filed: Feb. 5, 2016

(86) PCT No.: PCT/EP2016/052519
§ 371 (c)(1),
(2) Date: Aug. 2, 2017

(87) PCT Pub. No.: WO2016/134954
PCT Pub. Date: Sep. 1, 2016

(65) Prior Publication Data
US 2018/0024443 A1 Jan. 25, 2018

(30) Foreign Application Priority Data
Feb. 23, 2015 (EP) .................................. 15156118

(51) Int. Cl.
*G03F 7/20* (2006.01)
*G03F 1/70* (2012.01)
(Continued)

(52) U.S. Cl.
CPC ............ *G03F 7/70466* (2013.01); *G03F 1/70* (2013.01); *G03F 7/0002* (2013.01); *H01L 21/0337* (2013.01)

(58) Field of Classification Search
CPC .................................................. G03F 7/70466
See application file for complete search history.

(56) References Cited

U.S. PATENT DOCUMENTS 8,614,144 B2  12/2013  Kato
8,629,064 B2   1/2014  Li et al.
(Continued)

FOREIGN PATENT DOCUMENTS

EP   1818977     8/2007
TW   201214516   4/2012

OTHER PUBLICATIONS

International Search Report and Written Opinion dated Jun. 24, 2016 in corresponding International Patent Application No. PCT/EP2016/052519.
(Continued)

*Primary Examiner* — Kathleen Duda
(74) *Attorney, Agent, or Firm* — Pillsbury Winthrop Shaw Pittman LLP

(57) ABSTRACT

A functional device pattern is formed in a self-aligned multiple patterning process (e.g. SADP, SAQP). A first grid structure is formed on the substrate, the first grid structure including a plurality of elements in a first periodic arrangement. The first grid structure may be formed, for example, by a self-aligned pitch multiplication process. The first grid structure is then modified at specific locations in accordance with a cut mask, thereby to define the functional device pattern. In an intermediate step, a second grid structure is formed overlying the first grid structure. The second grid structure includes a plurality of elements in a second periodic arrangement. The elements of the second grid structure work in addition to the cut mask to constrain the locations at which the first grid structure is modified. Overlay and CD requirements of the cut mask can be relaxed.

20 Claims, 5 Drawing Sheets

(51) Int. Cl.
*H01L 21/033* (2006.01)
*G03F 7/00* (2006.01)

(56) References Cited

U.S. PATENT DOCUMENTS

| | | | |
|---|---|---|---|
| 9,865,473 B1* | 1/2018 | Ogino | ............... H01L 21/02164 |
| 2009/0017631 A1 | 1/2009 | Bencher | |
| 2010/0187611 A1 | 7/2010 | Schiwon et al. | |
| 2012/0225388 A1 | 9/2012 | Umatate et al. | |

OTHER PUBLICATIONS

Ban, Yongchan et al., "Layout Decomposition of Self-Aligned Double Patterning for 2D Random Logic Patterning", Proc. of SPIE vol. 7974, pp. 79740L-1-79740L-15 (2011).
English translation of Taiwan Office Action dated Mar. 7, 2017 for corresponding Taiwan Patent Application No. 105105172 (5 pages).
Abercrombie, David, "Self-Aligned Double Patterning, Part One", Semiconductor Engineering Magazine, May 15, 2014, 11 pages.
Abercrombie, David, "Self-Aligned Double Patterning—Part Deux", Semiconductor Engineering Magazine, Aug. 14, 2014, 11 pages.

* cited by examiner

DEVICE MANUFACTURING METHOD AND PATTERNING DEVICES FOR USE IN DEVICE MANUFACTURING METHOD

CROSS REFERENCE TO RELATED APPLICATION

This application is the U.S. national phase entry of PCT patent application no. PCT/EP2016/052519, which was filed on Feb. 5, 2016, which claims priority to European patent application no. 15156118.0, which was filed on Feb. 23, 2015, and which is incorporated herein in its entirety by reference.

BACKGROUND

Field of the Invention

The present invention relates to methods of manufacture of products such as semiconductor devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Multiple layers each having a particular pattern and material composition are applied to define functional devices and interconnections of the finished product.

Current and next generation processes often rely on so-called multiple patterning techniques to produce device features having dimensions far smaller than can be printed directly by the lithographic apparatus. Multiple patterning steps, each having its own mask or reticle, are performed to define a desired device pattern in a single layer on the substrate. Many different examples of multiple patterning are known. In some processes, a regular, grid structure is formed as a basis for the desired device pattern. Then using a circuit-specific mask pattern, lines that form the grid structure are cut at specific locations to separate the lines into individual segments. The grid structure may be exceptionally fine in dimensions, with a pitch in the tens or even teens of nanometers. A particular class of techniques is referred to as spacer multiple patterning or self-aligned multiple patterning, which may be referred to as SAxP. The 'x' stands for a multiplication factor, so that SADP for example refers to self-aligned double patterning. These techniques use pitch-multiplying processes to produce a grid structure which is two or more times finer than the pattern laid down by the lithographic apparatus. Examples of self-aligned pitch-multiplying processes are described for example in a U.S. Pat. No. 8,629,064. A tutorial introduction to SADP by David Abercrombie is available online at http://semiengineering.com/self-aligned-double-patterning-part-one/ and http://semiengineering.com/self-aligned-double-patterning-part-deux/. Further examples are described for example in a paper "Layout Decomposition of Self-Aligned Double Patterning for 2D Random Logic Patterning" by Yongchan Ban et al, Proc. of SPIE Vol. 7974 79740L-1, doi: 10.1117/12.879500.

Producing a grid structure several times finer than the resolution of the imaging system is of course challenging. Also challenging is the layout decomposition problem. However, final performance of the manufactured device in these examples also depends critically on the accuracy of positioning and dimensioning of the cut mask relative to the grid structure. (The cut mask in this context is what defines the circuit-specific locations at which the grid structure is modified to form functional circuits.) Overlay error may cause cutting or other modification to occur in a wrong place. Dimensional (CD) errors may cause cuts be too large, or too small (in an extreme case, cutting a neighboring grid line by mistake, or failing to cut the intended grid line completely).

SUMMARY OF THE INVENTION

The invention aims to improve the performance of multiple patterning processes in the manufacture of products. The invention is concerned particularly with those processes where a regular grid structure is formed and modified at product-specific locations.

The invention in a first aspect provides a method of applying a functional device pattern to a substrate by a sequence of lithographic processes, the lithographic processes including:

a first lithographic process wherein a first grid structure is formed on the substrate, the first grid structure comprising a plurality of elements in a first periodic arrangement; and a second lithographic process wherein the first grid structure is modified at specific locations in accordance with a mask pattern, thereby to define a functional device pattern, wherein a second grid structure is formed overlying the first grid structure, the second grid structure comprising a plurality of elements in a second periodic arrangement, the elements of the second grid structure constraining the locations at which the second lithographic process can modify the first grid structure.

The inventor has recognized that a regular grid structure, such as the second grid structure, can be positioned and dimensioned more accurately in a typical lithographic process, than an arbitrary (product-specific) mask pattern. By combining using the second grid structure as an additional guide to the modification step, positioning and/or dimensioning of the locations where modification occurs can be made more accurate than by using the mask pattern alone.

In embodiments of the invention, the second grid structure may be formed by an intermediate lithographic process performed prior to the second lithographic process. In principle, however, the second grid structure could be applied after formation of the mask pattern.

In embodiments of the invention, one or both of the grid structures can be formed using a pitch multiplying process such as a self-aligned (spacer) process.

In embodiments of the invention, modifying the first grid structure may comprise cutting elements of the grid structure. Other types of modification may be used in other embodiments. The first grid structure may for example comprise linear elements arrayed parallel to one another, each extending in a first direction. The second grid structure may for example comprise linear elements arrayed parallel to one another, each extending in a second direction.

In some embodiments of the invention, different subsets of the selected locations by separate lithographic processes, using two or more mask patterns. Different subset of elements of the first grid structure may be formed to have material properties resistant to different types of etching.

The invention further provides a method of manufacturing a device wherein a functional device pattern is applied to a substrate by a method according to the first aspect of the invention as set forth above, and functional device features are formed on the basis of the applied functional device pattern.

The invention further provides a set of patterning devices for use in manufacturing a product by a sequence of lithographic processes performed on a substrate, the set of patterning devices comprising:

a first grid patterning device adapted for forming a first grid structure on the substrate, the first grid structure comprising a plurality of elements in a first periodic arrangement;

a mask patterning device defining a mask pattern whereby the first grid structure can be modified at specific locations to define a functional device pattern; and a second grid patterning device adapted for forming a second grid structure overlying the first grid structure, the second grid structure comprising a plurality of elements in a second periodic arrangement, the elements of the second grid structure further constraining the locations at which the first grid structure can be modified using the mask pattern.

The patterning devices may take the form of physical masks or reticles. Alternatively, they may take the form of data sets defining patterns to be applied using a programmable patterning device.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
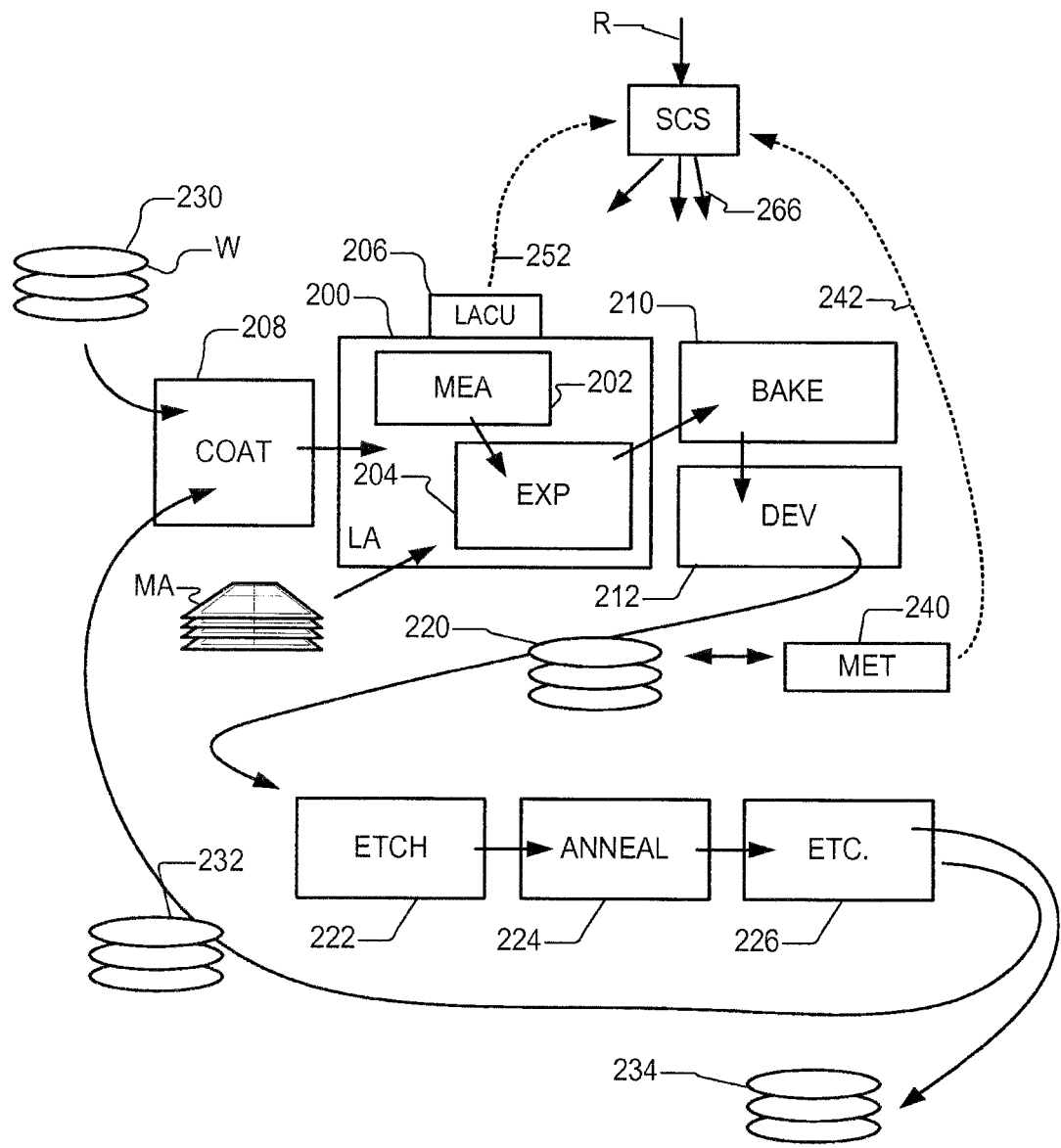
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables WTa and WTb and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 2:
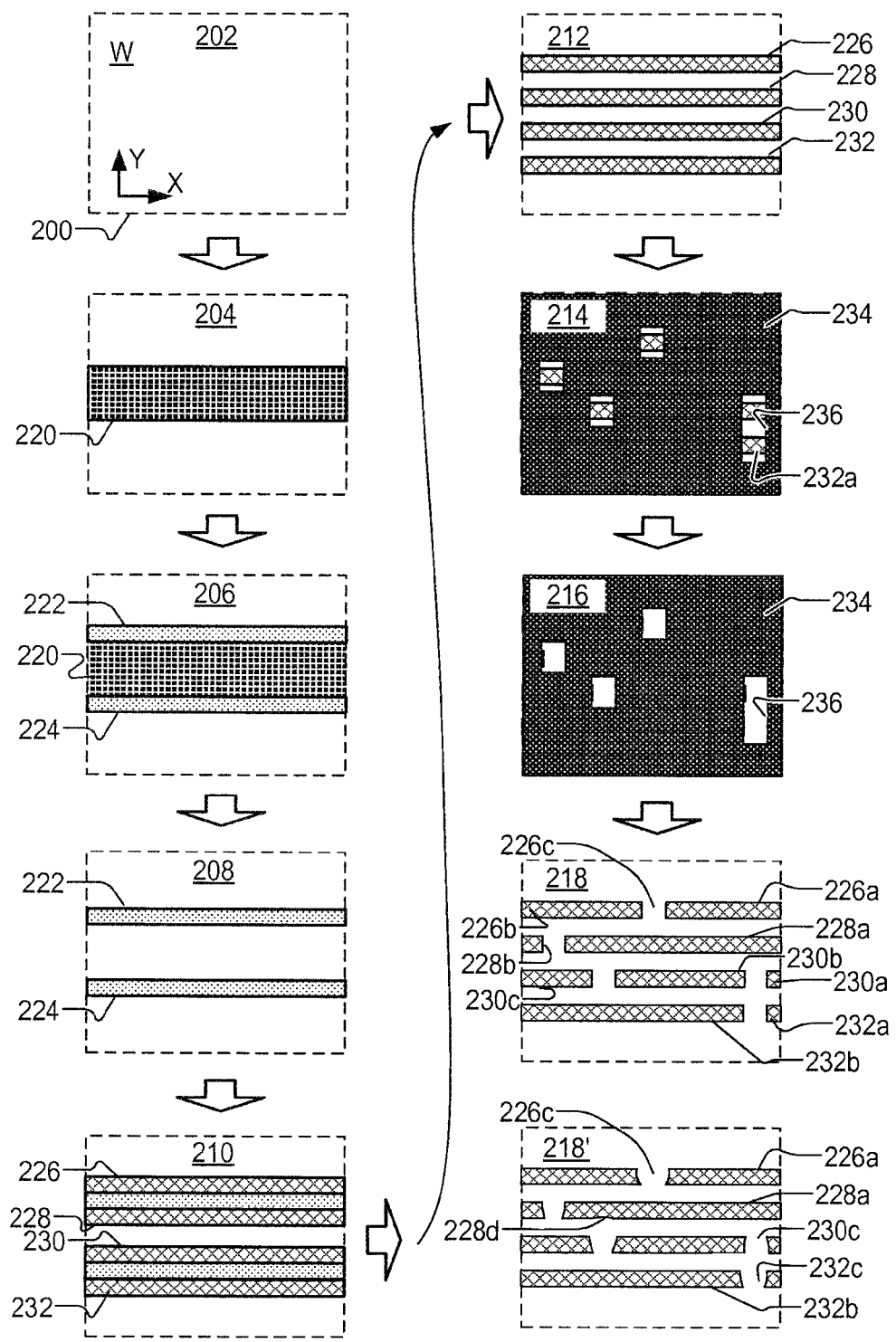
FIG. 2 illustrates stages in the formation of a functional device pattern using a known self-aligned multiple patterning process.

Referring to FIG. 2, we illustrate the application of multiple patterning to form very small product features a substrate W. In particular, a self-aligned multiple patterning process is illustrated, which allows the lithographic manufacturing system of FIG. 1 to form device structures far smaller than the resolution limits of the lithographic apparatus LA. The techniques disclosed in this application can be applied in other types of process. However, multiple patterning of this type is a promising technology that currently creates special challenges in terms of performance of the lithographic steps. In the example of FIG. 2, the processing will be described at a simplified level. The skilled reader will know that many variations of patterning are known, or may be developed in the future. The example presented in FIG. 2 is a self-aligned quadruple patterning process (SAQP), while self-aligned double patterning and octuple patterning processes are also known, for example. Generally, these processes can be labelled SA×P. More detail of such processes, and a variety of such processes, can be found in the literature, including the references given in the introduction.

A rectangular portion 200 of substrate W is represented at different stages of processing in the views 202 to 218. Between the views, block arrows represent one or more processing steps, not described in detail. At 202, we see the blank substrate W. It will be understood that, in a real application, one or more underlying layers may already be formed on the substrate, with or without functional device patterns and structures being applied therein. The processing illustrated in FIG. 2 concerns only one patterned layer as an example.

A first lithographic process performed with lithographic apparatus LA is performed, to define a first precursor grid pattern on the substrate. In this example, the first precursor grid pattern comprises a number of linear elements 220, of which just one is shown in view 204. Feature 220 is sometimes referred to as a mandrel. The mandrel may be formed, for example, of photosensitive resist material that has been exposed with a mandrel pattern, baked and developed in a conventional manner. The mandrel may be formed of other material, in a structure indirectly formed on the basis of a pattern in exposed resist.

Once the mandrel has been formed, chemical and physical processing is applied to form spacer elements 222, 224 along either side of the mandrel, as shown at 206. The spacer elements 222 and 224 are formed not by imaging but by a chemical and/or physical process so that they are "self-aligned" to the sides of the mandrel pattern. The mandrel is then removed as seen at 208. At this stage, it can be seen how a single precursor element 220 has been replaced by two elements 222, 224, so that pitch doubling has been achieved. To achieve pitch quadrupling, further spacer elements of yet another material are then formed either side of spacer elements 222, 224, giving four self-aligned spacer elements labelled 226, 228, 230 and 232 in the view 210. Purely by way of example, the first spacer elements 222, 224 may be formed of silicon nitride, while the second spacer elements 226-232 are formed of silicon oxide.

The double pitch spacer elements 222, 224 are then removed, leaving quadruple pitch array of linear features, as seen in view 212. This array of linear elements forms a first grid structure and may extend beyond the small area illustrated, both in the longitudinal direction of the elements 226 etc. (labelled X in the diagram), and in the orthogonal (Y) direction. The array of elements may be periodic in the Y direction. In a case where multiple mandrels 220 are formed with appropriate spacing in the Y direction, the array of elements 226 etc. can extend for multiple times the four elements shown, with the same periodicity or a different periodicity if desired.

At 212, we see how the pitch quadrupling has yielded a first grid structure which has a far finer pitch than anything that can be formed directly using lithographic apparatus LA. On the other hand, to form a functional device pattern, something more complicated than an array of linear features is generally required. Therefore the process involves as a next step the local modification of the elements of the grid. Typically, modification involves removing material at selected locations along the elements of the first grid structure, so as to cut each element into a number of individual elements. In the finished product, the elements may for example perform metallic conductors, connecting functional devices and other conductors formed in layers above and/or below the layer shown. Other types of modification may be envisaged in principle, and cutting will be used as an illustration in the following description, only because it is the most common example of modification. Also, modification of the elements should be understood as one example of modification of the first gird structure generally. Modification of the first grid structure could for example include locally bridging a gap between elements, rather than modifying the elements themselves. In this way, the gaps between elements become divided into disconnected gaps, which may be useful in forming functional device structures in subsequent process steps.

Returning to the illustrated example, to achieve the local cutting of the grid elements 226 etc., a second lithographic process is performed using a cut mask illustrated at 234 in view 214. Cut mask 234 can be formed of photosensitive resist material which substantially covers the first grid structure, except for small apertures 236. A patterning device (MA in FIG. 1) can be provided with the appropriate pattern to form the cut mask apertures by imaging in the resist. As can be seen in view 214, a small portion 232a of element 232 is exposed in the aperture 236. By a suitable etching process, all the exposed portions of the grid elements 226 etc. are removed, giving the condition shown at 216. After the cut mask 234 is removed, we see at 218 the functional device pattern which comprises a number of linear elements, separated by cuts or gaps. For example, we see element 226 has been divided into separate elements 226a and 226b, separated by a cut 226c at a location defined by the cut mask 234. Similarly, element 228 has been divided into two elements 228a and 228b by a cut. Element 230 has been divided into three elements 230a, 230b, 230c, by cutting at two locations, while element 232 has been cut at one location to form elements 232a and 232b.

For the purposes of this example, a pattern shown at 218 is considered to be the desired functional device pattern. In practice, further processing steps may be required to form a functional device structure of appropriate materials in accordance with this pattern. Alternatively, the elements of the first grid structure may be formed directly of the desired functional material.

Now, in this schematic illustration, cut mask 234 has been shown as formed with perfectly rectangular apertures, perfectly positioned at the desired locations along the elements 226 to 232 of the first grid structure. When operating at the limits of current lithographic technology, however, perfect formation of the cut mask, and perfect positioning of the apertures 236, are simply impossible. Limitations on the performance of the second lithographic process mean that the positions and the dimensions of the apertures (and hence the cuts) are subject to positioning errors (overlay) and dimensioning errors (CD error). Consequently, in a real process, the resulting device pattern may look more like the situation shown at 218'. Here, each cut such as the cut 226c, 230c is imperfectly dimensioned and/or imperfectly positioned. Overlay error in the X direction, for example, will cause the divided portions of elements 226 etc. to deviate from their ideal lengths and/or positions. Overlay error in the Y direction may cause the cut to be imperfectly formed. As illustrated at 228d, for example, a cut may even begin to be formed in the wrong element. Even if variations in overlay or CD are not so extreme to prevent a cut being formed, non-uniformity in overlay and CD will result in variations in the performance of electrical devices formed from the functional device pattern. This may in turn result in varying capacitances between different elements of a memory array, or logic array, degrading finished product performance or yield.

Figure 3:
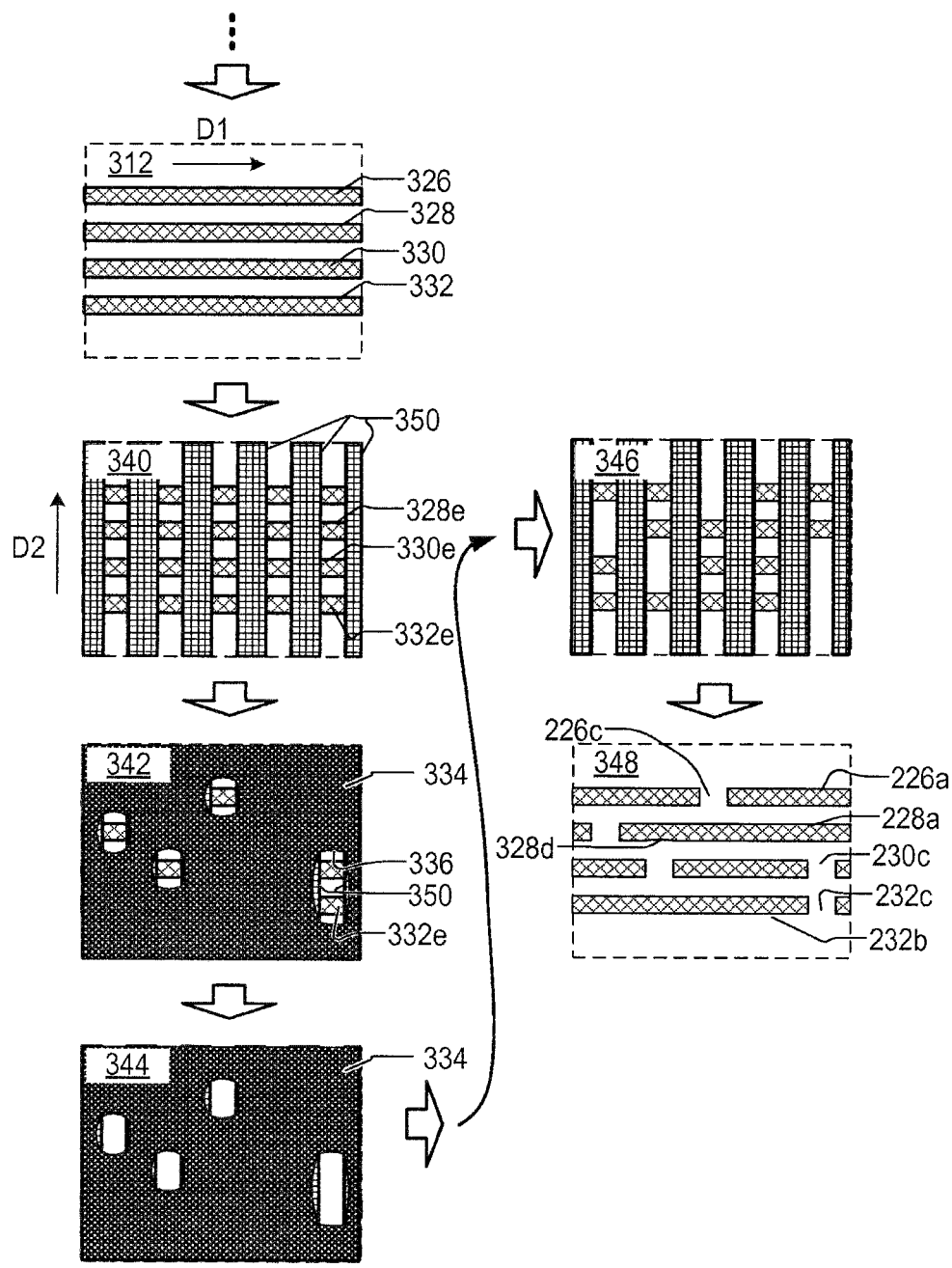
FIG. 3 illustrates stages in a grid-guided multiple patterning process according to a first embodiment of the present invention.

FIG. 3 illustrates a modified process, in which an intermediate grid structure is used to constrain the positions and dimensions of locations that are modified using a cut mask. The view at 312 is identical to the view at 212 in the process of FIG. 2. For the sake of this example, self-aligned pitch quadrupling can be used to reach this state, just as described above for FIG. 2. In any event, at 312 we see that a first grid structure has been formed on the substrate. Elements of the first grid structure are labelled 326 to 332, which may be considered identical to the elements 226 to 232 of the known process. The elements of the first grid structure in this example comprise linear elements extending in a first direction, labelled D1. This may be, for example of the X direction on the substrate but of course this is not necessarily so. The first grid structure is that it comprises a plurality of elements in a first periodic arrangement. The first grid structure may extend with the same periodicity in the orthogonal (Y) direction, although only four elements are shown in the illustration.

Subsequent to the preparation of the first grid structure, processing of the substrate according to the new method is illustrated in views 340, 342, 344, and 346 and 348. Processing steps are represented schematically by block arrows. It will be seen in view 342 that a cut mask 334 defining apertures 336 is applied, in a similar way to the invention of method of FIG. 2. However, prior to application of the cut mask, an intermediate lithographic process is used to form a second grid structure overlying the first grid structure. The second grid structure also comprises a plurality of elements in a (second) periodic arrangement. In the illustrated example, the second grid structure comprises elements 350, which are simply linear elements in a periodic grid, with each element extending in a second direction D2, transfers to the first direction D1. In this example, elements 350 extend in a direction orthogonal to the direction of the first elements 326 to 332. In principle, they may extend in a direction that is angled obliquely to direction D1 Elements 350 may be formed directly by the apparatus LA and photosensitive resist. They may alternatively be formed by using the lithographic apparatus to form a precursor structure, and then by applying pitch multiplying techniques, similar to those illustrated in FIG. 2. In a case where the manufacturing process requires the first grid structure to be fully exposed to use the resulting device pattern, the second grid structure will be formed of a material that can be removed without disturbing the first grid structure. As mentioned previously, it can be difficult in high volume manufacture to a desired accuracy in alignment and dimensioning of the cut mask apertures 336, relative to the desired locations for cutting the elements of the first grid structure. On the other hand, the inventor has recognized that lithographic processes employed today can achieve much better performance in regulating the CD and overlay when the applied pattern is a regular grid structure, compared with a more arbitrary pattern such as that of the cut mask.

In the new sequence of processing, as mentioned, the second grid structure formed of elements 350 is applied on top of the first grid structure, as shown at 340. In this way, only certain portions of the elements of the first grid structure are exposed to subsequent processing, for example the portions labelled 328e, 330e and 332e in the diagram. As shown at 342, when cut mask 334 with apertures 336 is applied over the grid structures, exposed portions 332e etc. are constrained not only by the selected locations defined by apertures in the cut mask, but by the intermediate layer of the second grid structure. As in the known process, etching of the elements of the first grid structure is then performed (as part of the second lithographic process) to remove exposed portions, giving the result shown at 344. The cut mask 334 is then removed, and optionally the second grid structure is also removed, as seen at 348.

Comparing the view at 348 with the views 218 and 218' seen in FIG. 2, we see that the functional device pattern produced in the FIG. 3 method is more like the ideal pattern 218 than the "realistic" pattern 318', in spite of imperfect CD and overlay in the cut mask 334. The reason that this improvement is achieved is that the elements 350 of the second grid structure have constrained the locations at which the etching (or other modifying) step can be performed on the underlying elements 326 etc. of the first grid structure. In particular, accuracy of positioning the modified portions of the elements of the first grid is improved in the first direction. This is because this accuracy depends substantially only on accuracy of placement and dimension of the second grid structure, and far less on the accuracy of placement and dimension of the apertures 336 in the cut mask 334. (Of course the apertures have to be positioned and dimensioned with a certain level of accuracy, but tolerances are greatly relaxed compared with the known method.) In this example where the second grid structure comprises linear elements, it does not constrain the location of modification in the second direction. Therefore, where a significant error in placement of an aperture in the second direction D2 is suffered, we may still see unwanted modification of element 328 at location 328d.

In other examples, the second grid structure may comprise a two-dimensional array of features. In that case, locations at which the first grid structure can be modified may be constrained in both directions. On the other hand, in such a process, the overlay and CD performance required in the second direction increases, when forming the second grid structure.

The skilled person can choose the detailed processes and materials appropriate to implement the described steps. Purely by way of example, it may be envisaged that the first grid structure is formed of some type of hard mask material (for example) silicon oxide, silicon nitride or polysilicon.

The second grid structure may be formed of (for example) silicon oxide, silicon nitride or polysilicon, and the cut mask 334 may be formed directly of developed resist.

Figure 4:
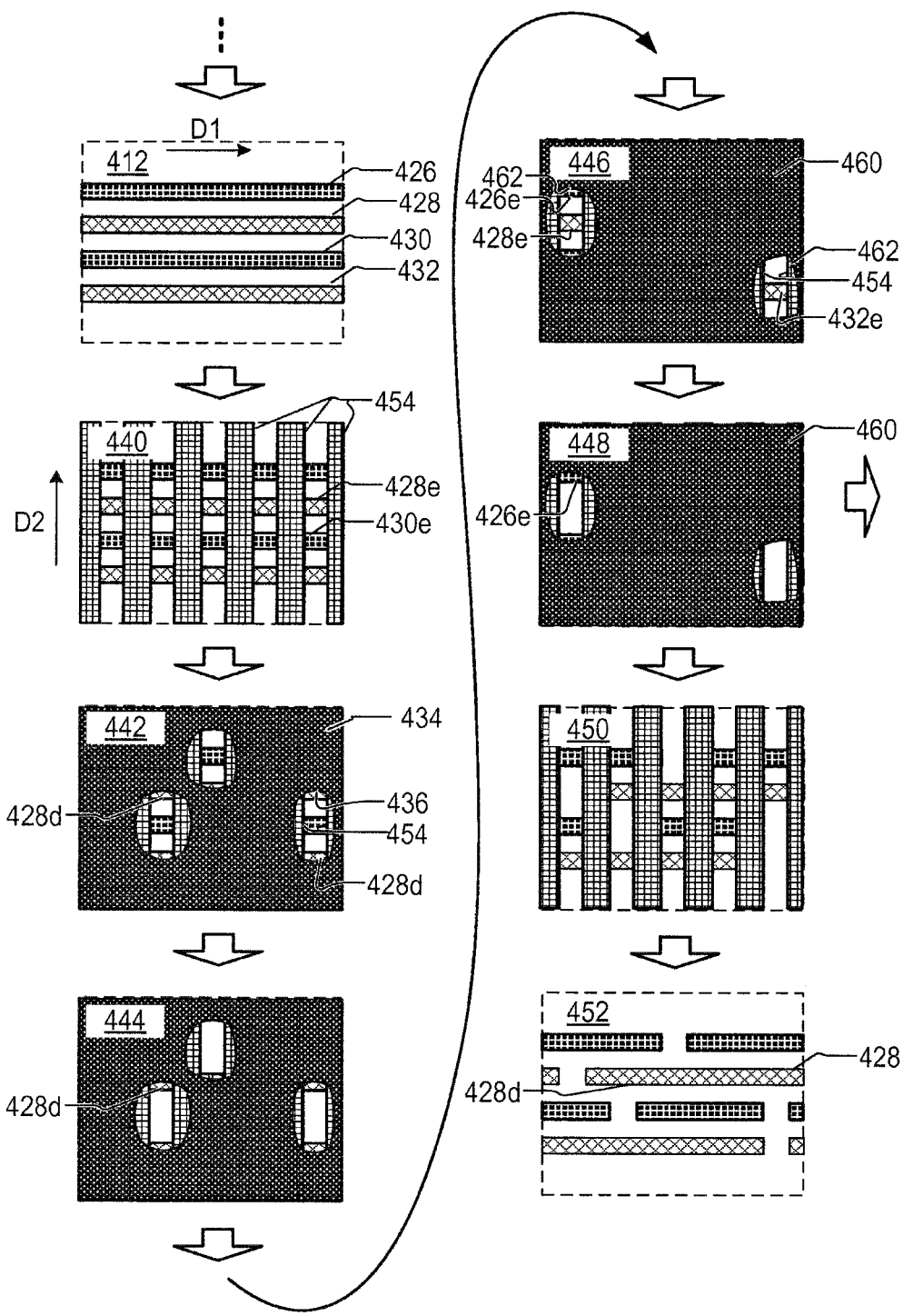
FIG. 4 illustrates stages in a grid-guided multiple patterning process according to a second embodiment of the present invention.

FIG. 4 shows a further modified method, which can be applied to further improve performance requirements in the second direction, without use of a two-dimensional second grid structure. Steps in the process are seen in the views 412, and 440 to 452. Processing is the same as in FIG. 3, except that the first grid structure (best seen in view 412) comprises elements formed of different materials, and modification of these elements is performed by two or more lithographic processes, each using a different cut mask.

At 412, we see a first grid structure which is similar in geometry to the first grid structure of the example of FIGS. 2 and 3, but comprises first and second subsets of elements, formed of different materials. A first subset of elements comprising elements 426 and 430 are formed so as to be removable by a first etching process. A second subset of elements comprising elements 428 and 432 are formed of a material selected so as to be resistant to the first etching process, but removable by a second etching process. The first material may be resistant to the second etching process, if desired.

As seen in view 440, a second grid structure is formed on top of the first grid structure, using lithographic apparatus LA and optionally one or more pitch doubling steps, to create linear elements 454. As in the previous example, the first grid structure comprises linear elements extending in a direction of D1, while the second grid structure comprises elements 454 extending in a second direction of D2. As in FIG. 3, only certain portions of the elements of the first grid structure are now exposed to subsequent processing, such as the portions labelled 428e and 430e.

Instead of using a single cut mask 334 to get to the desired device pattern seen at 452, a first cut mask 434 with fewer apertures 436 is applied over the second grid structure, as seen at 442. The apertures in the first cut mask correspond only to selected locations at which elements of the first subset in the first grid structure are to be modified (for example, cut). It will be seen that the apertures 436 in the first cut mask 434 are quite coarsely defined, so that not only portions of the first subset of elements but also portions 428d etc. of the second subset of elements are exposed. When a first etching process is performed through the first cut mask 434, however, only the exposed portions of the first subset of elements of the first grid structure are removed. For example, portion 428d of element 428 of the second subset of elements is unaffected by the particular etchant used in the first etching process.

At 446 we see that the first cut mask 434 has been removed and a second cut mask 460 has been formed over the second grid structure. In the second cut mask 460, apertures 462 correspond to locations where the elements of the second subset in the first grid structure are to be cut. Portions 428e and 432e are labeled, by way of example. As before, elements 454 of the second grid structure continue to cover portions of the elements where modification is to be constrained in the first direction. A second etching process is then performed using an etchant specific to the material of the second subset of elements of the first grid structure, to remove material as seen at view 448. In this example, materials and etching processes are selected so that portions of the elements of the first subset, such as portion 426e, are unaffected by the second etching process.

After both etching steps have been performed and the cut mask 460 has been removed, the substrate is as shown at 450. A desired device pattern is revealed when the second grid structure is removed at 452. This is identical to the formation of the functional device pattern seen at 348 in FIG. 3, except that, while the portion 428d was exposed by the cut mask 434 in the first etching step, the element 428 has not been etched in the first etching step, and so no defect is observed at 428d. In other words, the example demonstrates how the process can be more robust to overlay error in the second direction, by using different materials for different subsets of the elements of the first grid structure, these different materials having different etching properties.

In FIG. 3 and FIG. 4 alike, further steps can be performed, beyond the stage shown at 452, to transform the modified elements of the first grid structure into functional device features. Examples of functional device features include such as metal interconnect, transistor gate structures and the like.

Figure 5:
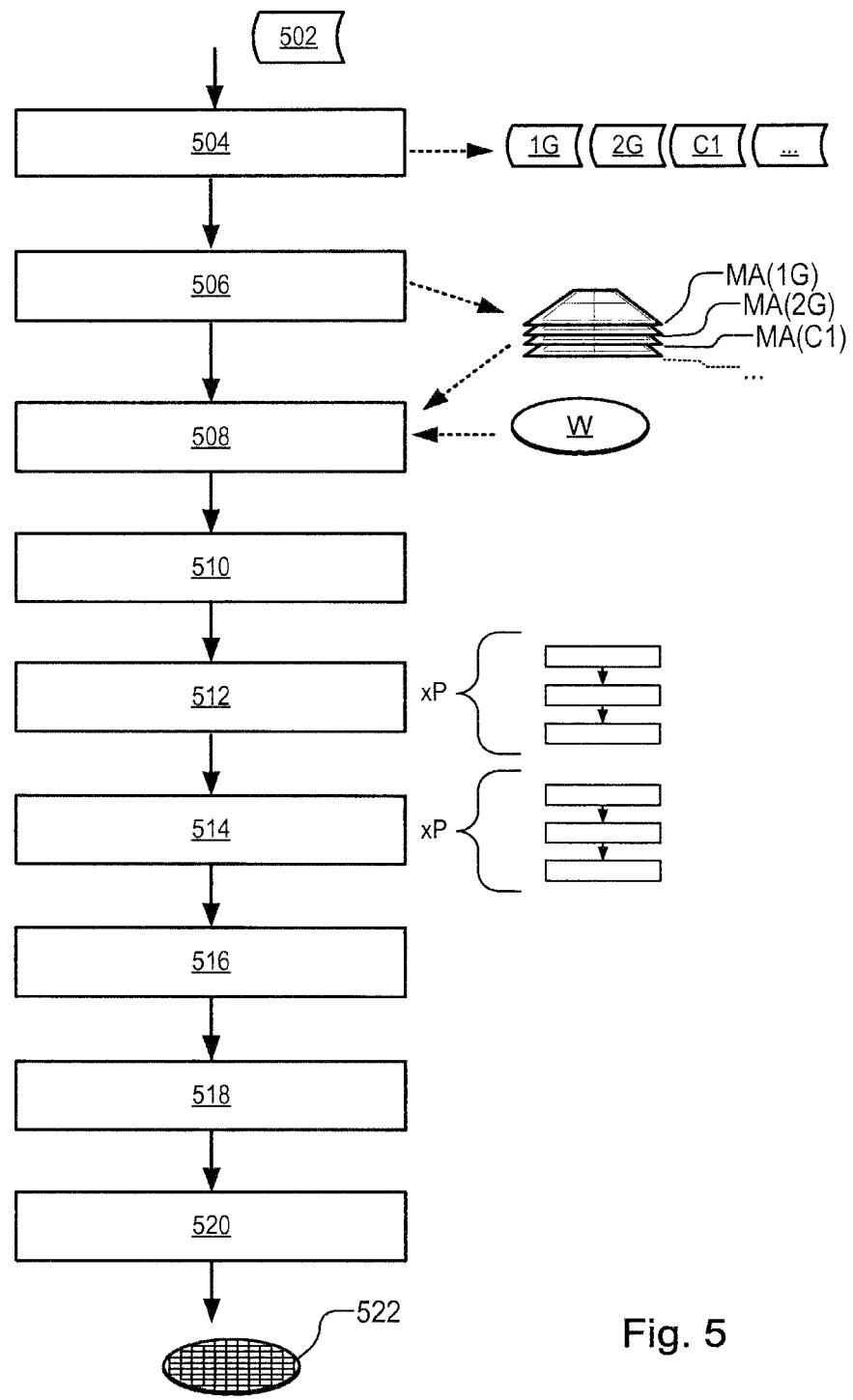
FIG. 5 is a flowchart of a device manufacturing process including the process illustrates in FIG. 3.

FIG. 5 is a flow chart illustrating the main steps of a device manufacturing method using the techniques introduced above. The method can be implemented for example using a lithographic manufacturing system such as the one shown in FIG. 1. The following steps of the method will be listed, and then explained in more detail below:

504: Decompose Design for SAxP
506: Manufacture Mask Set
508: Load Masks and Substrate
510: Prior Lithographic Processing
512: Form First Grid Structure
514: Form Second Grid Structure
516: Form Cut Mask & Modify Selected Locations
518: Remove Second Grid Structure leaving Functional Device Pattern
520: Further Processing to form Functional Device Structure At 502, a product 504 design is received in the form of a database. Originally, of course, some functional electronic circuit will be defined. For the manufacture of a semiconductor device implementing this circuit, the design is transformed into a device-level design and layout. The layout in turn is decomposed into as many functional device layers as are required to implement the required functional devices in the required layout. For the purpose, device features and device structures should be understood as including interconnection between layers. This decomposition is performed at step 504, where individual layer designs are prepared. For one layer to be made using the SAxP process, according to the examples above, layouts for a first grid structure (1G), a second grid structure (2G) and one or more cut masks (C1) are defined.

At 506, a set of patterning devices are generated, one for each element of the decomposed design. It may be noted that at this point that the designs of the first grid structure and second grid structure could be generic to a number of different functional product designs. Customization to a specific product design could be restricted to the cut mask, in principle. It should also be noted that, while physical masks (for example transmissive or reflective reticles) are illustrated as examples of patterning devices MA, the patterning devices may also be implemented as data for use in controlling a programmable patterning device in a suitable lithographic apparatus. Different types of patterning device may be combined in the same mask set. The various lithographic processes employed in the method need not be performed on the same lithographic apparatus, or even on the same type of lithographic apparatus.

At 508, a blank substrate W is loaded into a lithographic apparatus LA, along with the mask set. For simplicity, it is assumed that the same lithographic apparatus applies every pattern to a given substrate or batch of substrates. In practice, however, different apparatuses may be used for different layers, or different decomposed elements of layers, in the same production process. Step 510 represents preliminary processing of the substrate and layers beneath the functional device pattern that is to be formed by SA×P processing. As explained and illustrated in FIG. 1, this processing may involve several iterations of lithographic patterning developing, etching and the like.

For the production of a functional device pattern according to the SA×P process illustrated in FIG. 3, in step 512 the lithographic manufacturing system is used with the appropriate patterning device MA(G1). to form a first grid structure comprising a plurality of elements in a first periodic arrangement. The elements may for example be linear elements, as illustrated in FIGS. 2 to 4. The elements may alternatively be arranged in some two dimensional grid structure, for example to form contact holes or pillars. If the first grid structure is to be formed by pitch multiplication, several sub-processes are implied in step 512, as illustrated schematically to the right of step 512.

At step 514, the second grid structure is applied on top of the first grid structure, using the appropriate patterning device MA(G2). As for the first grid structure, this may also involve pitch multiplication. The materials and processing to form the second grid structure may be different from those used to form the first grid structure.

At 516, using the cut mask patterning device MA(C1) selected locations on the elements of the first grid structure are modified (for example cut), using the elements of the second grid structure to constrain the locations at which modification is effected more precisely than the locations are constrained by the cut mask itself. Naturally, in an example where two cut masks are used, step 516 will be repeated using different patterning devices, and step 512 will be performed so that different subsets of the elements of the first grid structure are formed of materials having different properties. That variation is not illustrated, but can be readily understood by the skilled reader.

At 518 a cut mask and second grid structure are removed to leave the functional device pattern. At 520 further processing is applied as necessary to form functional device structures based on the functional device pattern, and to form further device structures in subsequent layers, until the finished product is released at 522.

All of the above steps can be performed using known techniques, and/or techniques to be developed in future. In the finished product, overlay and CD performance in one or both dimensions is governed by the accuracy of placement and dimensioning of the second grid structure relative to the first grid structure primarily, and accuracy of placement and dimensioning of the cut mask or cut masks becomes less critical.

In all of the above examples, the skilled person will appreciate that several distinct processing steps may be involved in moving from view to view. Depending on the nature of the process to be performed, different materials can be selected to serve as the first grid structure elements, as the second grid structure elements, and as one or more cut masks. As is known in the art, different types of self-aligned spacer technologies can be used for multiple patterning. In some types of process, the spacers correspond to physical features such as metal interconnect in the finished functional device structure. In other types of process, the absence of spacer material defines locations where functional material will be in the final functional device structure. The principle of using a second grid structure as a guide can be applied in a wide variety of processes. In particular, the principle of using a second grid structure to constrain the locations which a first grid structure is modified can be applied in processes with or without pitch multiplication.

As mentioned already, cutting the elements of the first grid structure is not the only type of modification that might be performed at the selected locations. While the second lithographic process in the above example forms cut masks having apertures through which modification is performed at selected locations, another example might use a mask in which modification is performed over the majority of the device area, and small islands of resist or other mask material protect selected locations from modification.

In the illustrated examples, the second grid structure is formed by an intermediate lithographic process performed prior to the second lithographic process. In principle, however, the second grid structure could be applied after formation of the cut mask.

While specific embodiments of the invention have been described above, it will be appreciated that the invention may be practiced otherwise than as described. In association with the novel patterning devices and methods, an embodiment may include a computer program containing one or more sequences of machine-readable instructions describing a methods of producing patterning devices and/or controlling the subsequent lithographic process in which they are used. This computer program may be executed for example within supervisory control system SCS of FIG. 1 or the control unit LACU of lithographic apparatus 200/LA. There may also be provided a data storage medium (e.g., semiconductor memory, magnetic or optical disk) having such a computer program stored therein.

Although patterning devices in the form of a physical reticle have been described, the term "patterning device" in this application also includes a data product conveying a pattern in digital form, for example to be used in conjunction with a programmable patterning device.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The invention may further be described using the following clauses:

1. A method of applying a functional device pattern to a substrate by a sequence of lithographic processes, the lithographic processes including:

a first lithographic process wherein a first grid structure is formed on the substrate, the first grid structure comprising a plurality of elements in a first periodic arrangement; and a second lithographic process wherein the first grid structure is modified at specific locations in accordance with a mask pattern, thereby to define a functional device pattern, wherein a second grid structure is formed overlying the first grid structure, the second grid structure comprising a plurality of elements in a second periodic arrangement, the elements of the second grid structure constraining the locations at which the second lithographic process can modify the first grid structure.

2. A method as in clause 1 wherein the first lithographic process comprises applying a first precursor grid pattern onto the substrate, the first precursor grid pattern having a lower spatial frequency than the first grid structure, and using a pitch multiplying process to form the first grid structure based on the first precursor grid pattern.

3. A method as in clause 2, wherein the pitch multiplying process comprises a self-aligned spacer multiple-patterning process.

4. A method as in any preceding clause wherein a pitch multiplying process is used to form the second grid structure based on a second precursor grid pattern having a lower spatial frequency than the second grid structure.

5. A method as in clause 4, wherein the pitch multiplying process used to form the second grid structure comprises a self-aligned spacer multiple-patterning process.

6. A method as in any preceding clause wherein the second grid structure is formed by an intermediate lithographic process performed prior to the second lithographic process.

7. A method as in any preceding clause wherein the second lithographic process modifies the first grid structure at a first subset of selected locations to define the functional device pattern partially, and the method further comprises a third lithographic process that modifies the first grid structure at a second subset of selected locations, in accordance with a second mask pattern, to complete the definition of the functional device pattern.

8. A method as in clause 7, wherein the second lithographic process modifies a first subset of elements at a first subset of said selected locations and the third lithographic process modifies a second subset of elements at a second subset of selected locations, and wherein the second subset of elements are formed to have material properties resistant to modification by the second lithographic process.

9. A method as in any preceding clause wherein modifying an element of the first grid structure at a selected location comprises cutting the element at the selected locations to form disconnected elements.

10. A method as in any preceding clause wherein the elements of the first grid structure comprise linear elements each extending in the first direction and modifying an element of the first grid structure at a selected location comprises cutting the element at the selected locations to form a disconnected pair of linear elements.

11. A method as in any preceding clause wherein the first grid structure comprises linear elements arrayed parallel to one another, each extending in a first direction.

12. A method as in any preceding clause wherein the second grid structure comprises linear elements arrayed parallel to one another, each extending in a second direction.

13. A method as in any preceding clause wherein the first grid structure comprises linear elements arrayed parallel to one another, each extending in a first direction and the second grid structure comprises linear elements arrayed parallel to one another, each extending in a second direction.

14. A method as in clause 13 wherein the second direction is orthogonal to the first direction.

15. A method as in any preceding clause further comprising removing the second grid structure prior to performing subsequent processing steps on the functional device pattern.

16. A method of manufacturing a device wherein a functional device pattern is applied to a substrate by a method as described in any preceding clause, and functional device features are formed on the basis of the applied functional device pattern.

17. A set of patterning devices for use in manufacturing a product by a sequence of lithographic processes performed on a substrate, the set of patterning devices comprising:

a first grid patterning device adapted for forming a first grid structure on the substrate, the first grid structure comprising a plurality of elements in a first periodic arrangement;

a mask patterning device defining a mask pattern whereby the first grid structure can be modified at specific locations to define a functional device pattern; and a second grid patterning device adapted for forming a second grid structure overlying the first grid structure, the second grid structure comprising a plurality of elements in a second periodic arrangement, the elements of the second grid structure further constraining the locations at which the first grid structure can be modified using the mask pattern.

18. A set of patterning devices as in clause 17 wherein the first grid patterning device defines a precursor pattern for use in forming the first grid structure by a pitch multiplying process.

19. A set of patterning devices as in clause 17 or 18 wherein the second grid patterning device defines a precursor pattern for use in forming the second grid structure by a pitch multiplying process.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of applying a functional device pattern to a substrate by a sequence of lithographic processes, the method including:

a first lithographic process wherein a first grid structure is formed on the substrate, the first grid structure comprising a plurality of elements in a periodic arrangement; and a second lithographic process wherein the first grid structure is modified at specific locations in accordance with a mask pattern, thereby to define a functional device pattern, wherein a second grid structure is formed overlying the first grid structure, the second grid structure comprising a first plurality of elements in a first periodic arrangement arranged in a first direction and a second plurality of elements in a second periodic arrangement arranged in a second direction at an angle to the first direction, the elements of the second grid structure constraining the locations at which the second lithographic process can modify the first grid structure and the mask pattern formed in a layer overlying the first and second grid structures.

2. A method as claimed in claim 1, wherein the first lithographic process comprises applying a first precursor grid pattern onto the substrate, the first precursor grid pattern having a lower spatial frequency than the first grid structure, and using a pitch multiplying process to form the first grid structure based on the first precursor grid pattern.

3. A method as claimed in claim 2, wherein the pitch multiplying process comprises a self-aligned spacer multiple-patterning process.

4. A method as claimed in claim 1, wherein a pitch multiplying process is used to form the second grid structure based on a second precursor grid pattern having a lower spatial frequency than the second grid structure.

5. A method as claimed in claim 4, wherein the pitch multiplying process used to form the second grid structure comprises a self-aligned spacer multiple-patterning process, and wherein the second grid structure is formed by an intermediate lithographic process performed prior to the second lithographic process.

6. A method as claimed in claim 1, wherein the second lithographic process modifies the first grid structure at a first set of selected locations to define the functional device pattern partially, and the method further comprises a third lithographic process that modifies the first grid structure at a second set of selected locations, in accordance with a second mask pattern, to further define the functional device pattern.

7. A method as claimed in claim 6, wherein the second lithographic process modifies a first subset of the elements of the first grid structure at the first set of selected locations and the third lithographic process modifies a second subset of the elements of the first grid structure at the second set of selected locations, and wherein the second subset of elements of the first grid structure are formed to have a material property resistant to modification by the second lithographic process.

8. A method as claimed in claim 1, wherein modifying an element of the first grid structure at a selected location comprises cutting the element at the selected location to form disconnected elements.

9. A method as claimed in claim 1, wherein the first grid structure comprises linear elements arrayed parallel to one another, each extending in the first direction and the second grid structure comprises linear elements arrayed parallel to one another, each extending in the second direction.

10. A method as claimed in claim 9, wherein the second direction is orthogonal to the first direction.

11. A method as claimed in claim 1, further comprising, after the second lithographic process, removing the second grid structure, while keeping the first grid structure, prior to performing subsequent processing steps on the functional device pattern.

12. A method of manufacturing a device wherein a functional device pattern is applied to a substrate by the method as claimed in claim 1, and functional device features are formed on the basis of the applied functional device pattern.

13. A method of applying a functional device pattern to a substrate by a sequence of lithographic processes, the method including:
  a first lithographic process wherein a first grid structure is formed on the substrate, the first grid structure comprising a plurality of elements in a periodic arrangement;
  a second lithographic process wherein the first grid structure is modified at a first set of selected locations in accordance with a first mask pattern formed in a layer overlying the first grid structure, to define in at least part a functional device pattern, wherein a second grid structure is formed overlying the first grid structure, the second grid structure comprising a plurality of elements in a periodic arrangement, the elements of the second grid structure constraining the locations at which the second lithographic process can modify the first grid structure;
  a third lithographic process wherein the first grid structure is modified at a second set of selected locations in accordance with a second mask pattern formed in a layer overlying the first and second grid structures, to further define the functional device pattern,
  wherein the second lithographic process modifies a first subset of the elements of the first grid structure at the first set of selected locations and the third lithographic process modifies a second subset of the elements of the first grid structure at the second set of selected locations, and
  wherein the second subset of the elements of the first grid structure are formed to have a material property resistant to modification by the second lithographic process.

14. A method as claimed in claim 13, wherein the first lithographic process comprises applying a first precursor grid pattern onto the substrate, the first precursor grid pattern having a lower spatial frequency than the first grid structure, and using a pitch multiplying process to form the first grid structure based on the first precursor grid pattern.

15. A method as claimed in claim 13, wherein a pitch multiplying process is used to form the second grid structure based on a second precursor grid pattern having a lower spatial frequency than the second grid structure.

16. A method as claimed in claim 13, wherein the first grid structure comprises linear elements arrayed parallel to one another, each extending in a first direction and the second grid structure comprises linear elements arrayed parallel to one another, each extending in a second direction.

17. A method as claimed in claim 16, wherein the second direction is orthogonal to the first direction.

18. A method as claimed in claim 13, wherein the first subset of the elements of the first grid structure is made of a different material than the second subset of the elements of the first grid structure.

19. A method as claimed in claim 13, wherein the second grid structure comprises a first plurality of elements in a first periodic arrangement arranged in a first direction and a second plurality of elements in a second periodic arrangement arranged in a second direction at an angle to the first direction.

20. A method of manufacturing a device wherein a functional device pattern is applied to a substrate by the method as claimed in claim 13, and functional device features are formed on the basis of the applied functional device pattern.

\* \* \* \* \*